(12) United States Patent
Stoddard et al.

(10) Patent No.: US 6,778,043 B2
(45) Date of Patent: Aug. 17, 2004

(54) METHOD AND APPARATUS FOR ADDING INDUCTANCE TO PRINTED CIRCUITS

(75) Inventors: Donald Joseph Stoddard, San Jose, CA (US); Matthew J. Schumacher, Cypress, TX (US)

(73) Assignee: Maxxan Systems, Inc., San Jose, CA (US)

( * ) Notice: Subject to any disclaimer, the term of this patent is extended or adjusted under 35 U.S.C. 154(b) by 157 days.

(21) Appl. No.: 10/025,665

(22) Filed: Dec. 19, 2001

(65) Prior Publication Data

US 2003/0112615 A1 Jun. 19, 2003

(51) Int. Cl.[7] .................................................. H01P 3/08
(52) U.S. Cl. ...................................... 333/246; 174/266
(58) Field of Search ................................. 333/238, 246; 174/266

(56) References Cited

U.S. PATENT DOCUMENTS

| | | | | |
|---|---|---|---|---|
| 4,853,660 A | * | 8/1989 | Schloemann | ............ 333/246 X |
| 5,312,674 A | * | 5/1994 | Haertling et al. | ............ 428/210 |
| 5,438,167 A | * | 8/1995 | McClanahan et al. | .. 333/246 X |
| 5,745,981 A | * | 5/1998 | Roshen et al. | .......... 333/112 X |

* cited by examiner

Primary Examiner—Benny Lee
(74) Attorney, Agent, or Firm—Trop, Pruner & Hu, P.C.

(57) ABSTRACT

A method and apparatus for adding inductance is disclosed. Inductance may be added to a transmission line coupled to a printed circuit board to increase the inductance associated with a transmission line by utilizing ferromagnetic materials.

6 Claims, 9 Drawing Sheets

METHOD AND APPARATUS FOR ADDING INDUCTANCE TO PRINTED CIRCUITS

FIELD OF THE INVENTION

The present invention relates to producing printed-circuit boards with transmission lines utilizing inductance.

BACKGROUND

Printed circuit boards are widely utilized in the electronics industry. They typically consist of multilayer substrates having copper traces and plated-through holes to connect electronic components mounted on the circuit board.

Producing a plated-through hole ("via") on a multilayer printed-circuit board is typically performed by boring through the typically copper-clad printed-circuit board at locations at which a via is desired. Then, using typically a galvanic process, copper is deposited on the inner wall of the bored hole forming a conductor that connects a top surface of the printed-circuit board to the bottom surface of the printed-circuit board. Along with plating the bore of the via hole, the copper also typically covers the top and bottom surfaces of the printed-circuit board to form conductive surfaces thereon. Subsequently, the copper surfaces are etched as desired to form circuitry. This circuitry may form a transmission line that connects two or more electronic devices together.

Multi-layer printed-circuit boards, in addition to the top and bottom conductive surfaces, typically include middle layers that are also conductive. These middle layers may be used for a variety of purposes including distributing power and ground connections to the variety of devices that may be assembled on the printed-circuit board. In some cases, it may be desired that a via connect the top and bottom connective surfaces of the printed-circuit board but remain isolated from ore or more of the middle layers that may be utilized as ground and power planes.

However, while there may not be a direct electrical connection between the isolated via and the ground and power planes, there is nevertheless a capacitance effect which couples signals that may be conducted by the via to the ground and power planes. This capacitance effect is exacerbated as the frequency of the signals which may be conducted by the via increase. At frequencies exceeding a gigahertz range, this effect may become significant and serve to limit the distance with which signals may be coupled on the printed-circuit board or through connectors to other circuit boards.

The current trend in the industry is to use higher frequency signals, thus there is a need in the industry for an improved method of propagating high frequency signals utilizing printed-circuit boards.

BRIEF DESCRIPTION OF THE DRAWINGS

The invention may be best understood by referring to the following description and accompanied drawings that are used to illustrate embodiments of the invention. In the drawings.

DETAILED DESCRIPTION

In the following description of the invention, numerous specific details are set forth to provide a detailed understanding of the present invention. However, one skilled in the art will readily appreciate that the present invention may be practiced without these specific details. The specific details are provided by way of example and not by way of limitation.

In the drawings, like or similar elements are designated with identical reference numerals throughout the several views and may not be described in detail for all drawing figures. Also, the various elements depicted are not necessarily drawn to scale.

Figure 1:
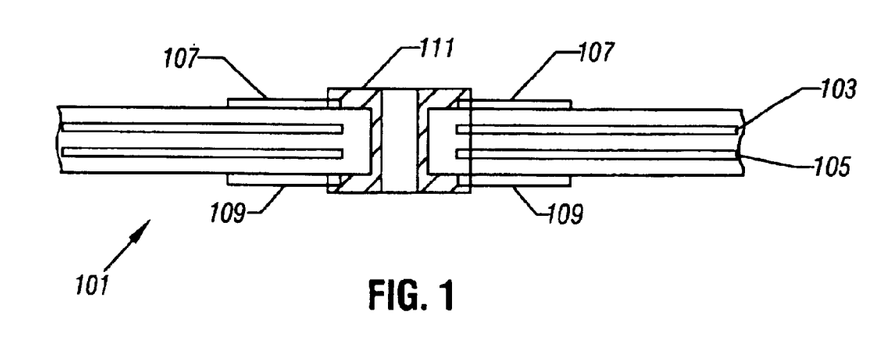
FIG. 1 is a cross-sectional view of a multi-layer printed-circuit board according to same embodiments of the present invention.

Referring to FIG. 1, a multi-layer printed-circuit board 101 includes inner conductive layers ("planes") 103 and 105. Additionally, thee printed-circuit board 101 includes an upper conductive layer 107 and a bottom conductive layer 109. In some embodiments, the printed-circuit board 101 includes a conductive via 111 that may serve to connect the top layer 107 to the bottom layer 109 in some embodiments. However, in other embodiments, the via may connect the top layer 107 to another layer (not shown) or connect the bottom layer 109 to another layer (not shown). In still other embodiments, the via may connect middle layers (not shown) together.

The planes 103 and 105 may in some embodiments be utilized to distribute power and ground to various devices that may be located on the printed-circuit board 101. The conductive layers 107 and 109 may seize to connect signals from one or more devices from the top layer 107 to the bottom layer 109 through the conductive via ill. This signal path may form a transmission line between the devices (not shown).

Figure 2:
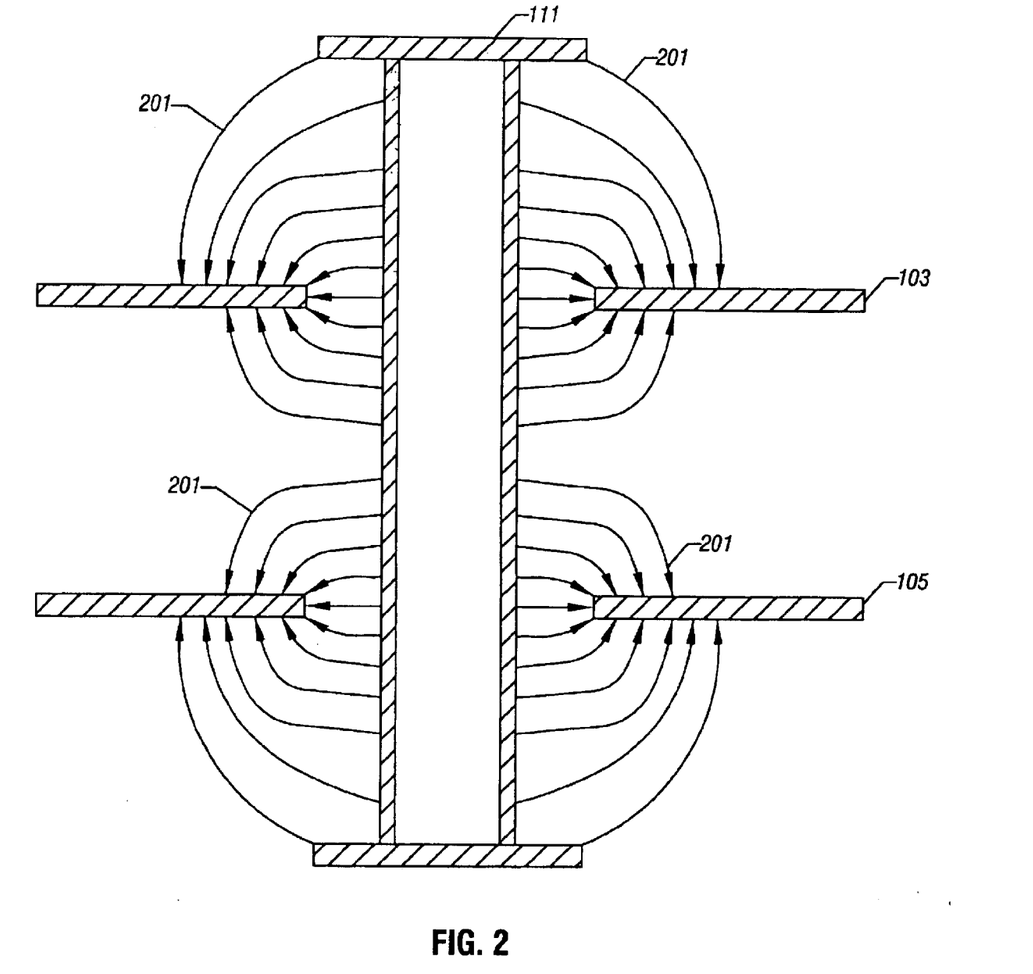
FIG. 2 is an exploded cross-sectional view of a via according to some embodiments of the present invention.

Referring to FIG. 2, the conductive via 111 and the conductive planes 103 and 105 are illustrated. In addition, the electrical field lines 201 are illustrated to represent the capacitive coupling between the conductive via 111 and the conductive planes 103 and 105. The amount of capacitive coupling between the conductive via 111 and the conductive planes 103 and 105 may be dependent on many factors including the spacing between the conductive via 111 and the conductive planes 103 and 105. Additionally, the thicknesses of the various materials including the conductive material making up the conductive planes 103 and 105 may determine, in part, the amount of capacitance between the conductive via 111 and the conductive planes 103 and 105.

Low frequency signals that may be propagated through the conductive via 111 may not be substantially effected by the capacitance between the conductive via 101 and the conductive planes 103 and 105. However, as the frequency of the signals that may be propagating through the conductive via 111 increase, the effect of the capacitance on the signal integrity may also increase.

Figure 3:
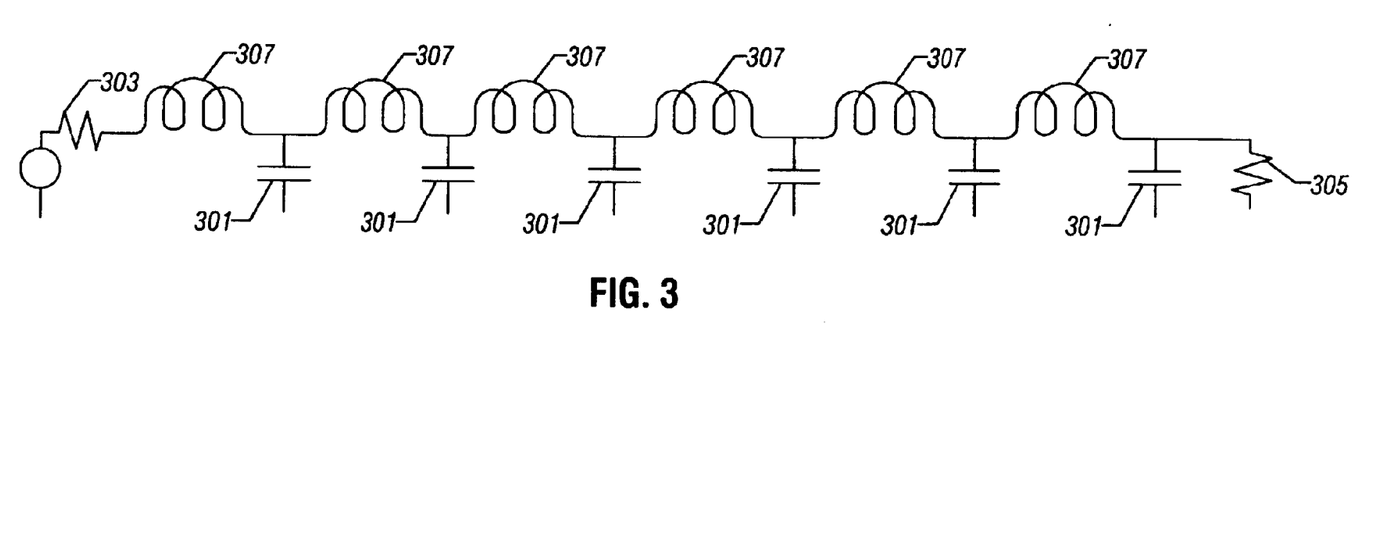
FIG. 3 is a schematic representation of a transmission line.

The conductive via 111 has the characteristic of a transmission line. That means it has inductance and capacitance distributed along its length as illustrated in FIG. 3. As illustrated, the capacitors 301 may be the capacitance due to the capacitive coupling between the conductive via 111 and the conductive planes 103 and 105 as shown in FIGS. 1 and 2. The resistance 303 may be the source resistance of a driving device while resistor 305 may represent a load impedance. The inductors 307 may represent the inherent inductance of the conductive via and associated traces. The inductance and capacitance of the via and associated traces gives the signal path (transmission line) a characteristic impedance.

The ratio of inductance to capacitance can theoretically be changed to create any required characteristic impedance. Ideally, the characteristic impedance of the transmission line is such that signal integrity is minimally degraded which may mean the characteristic impedance of the transmission line is similar to the impedance of the resistive load 305 in some embodiments. In some embodiments the characteristic impedance of the transmission line is similar to the source and load impedance.

To achieve a desired transmission line impedance, inductance 307 must often be increased over that which may be achieved utilizing copper conductive traces and copper plated vias. However, this increase in inductance may be achieved, in some embodiments, by constructing the conductive via 111 with ferromagnetic material. As one example, nickel may be utilized as the ferromagnetic material.

Figure 4:
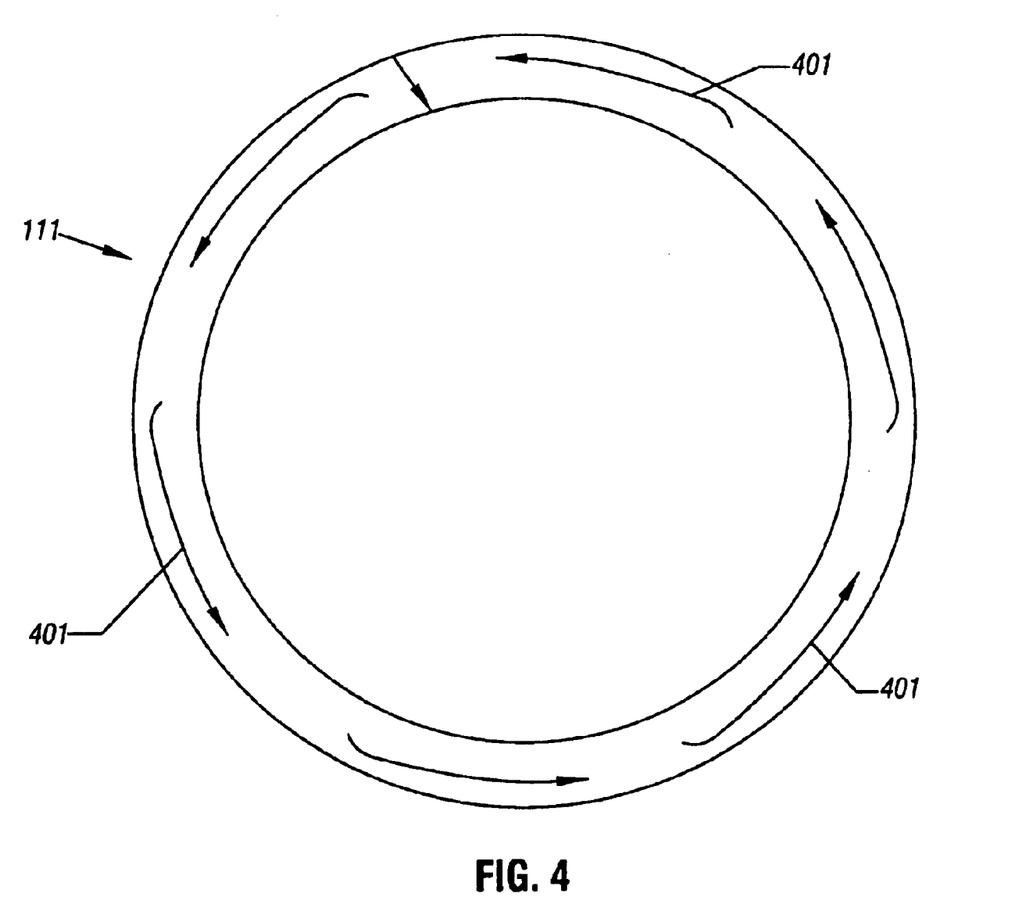
FIG. 4 is a cross-sectional view of a ferromagnetic via according to some embodiments of the present invention.

Referring to FIG. 4, by manufacturing a via out of a ferromagnetic material, for example nickel, the current flowing within the via produces a surrounding magnetic field represented by arrows 401. The magnetic field 401 is increased by the high permeability a the ferromagnetic material utilized to make up the conductive via 111.

By adjusting the permeability of the ferromagnetic material and/or the dimensions of the via utilized, the amount of inductance may be changed. This change in inductance may be utilized to ensure that the resultant transmission line may present a desired characteristic impedance.

Figure 5:
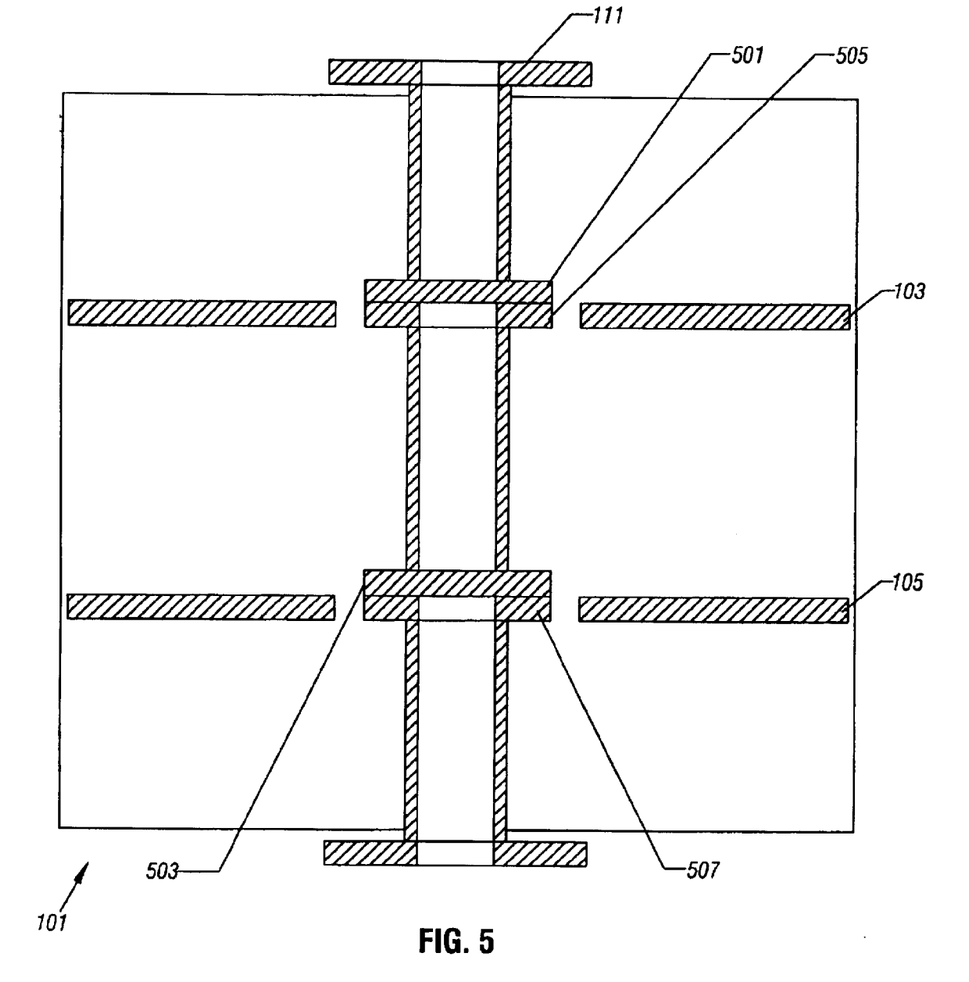
FIG. 5 is a cross-sectional view of a multi-layer printed circuit board having a via within ferromagnetic collars according to some embodiments of the present invention.

Referring now to FIG. 5, in an additional embodiment, the conductive via 111 may be constructed with ferromagnetic collars 501 and 503. These ferromagnetic collars 501 and 503 may serve to create a high inductance at the interface between the via 111 and the conductive planes 103 and 105.

These ferromagnetic rings 501 and 503 may be constructed, in some embodiments, by plating a ferromagnetic material, for example nickel, on cop of pads 505 and 507. The pads 505 and 507 may be constructed using the same processes and method used to construct conductive planes 103 and 105 in some embodiments.

Figure 6:
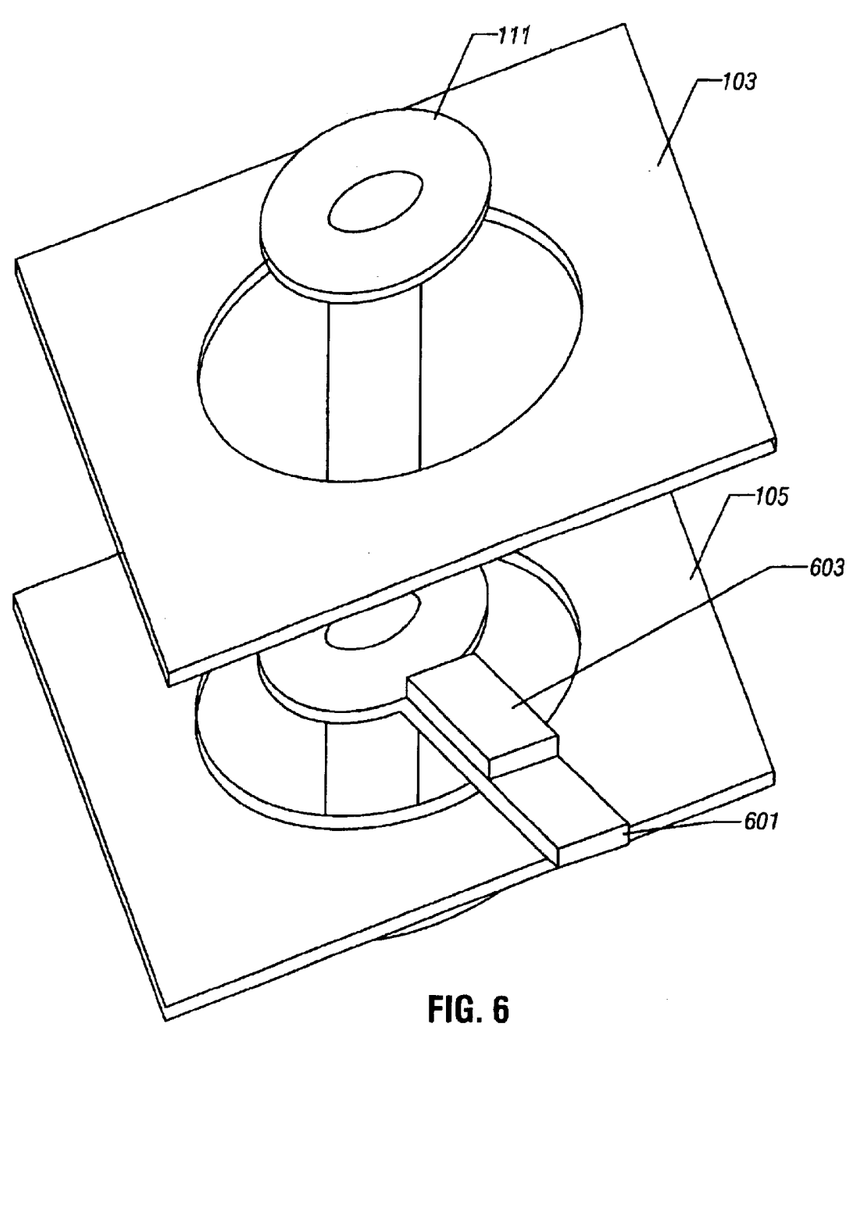
FIG. 6 is an exploded partial view of a multi-layer printed-circuit board with a signal trace having a ferromagnetic plating thereon according to some embodiments of the present invention.

As still another embodiment, to increase the inductance of a particular transmission line, a ferromagnetic material may be plated on top of a signal trace. As best illustrated in FIG. 6, a signal trace 601 includes a ferromagnetic plated section 603. This ferromagnetic section may be any suitable ferromagnetic material of which nickel is one example. By adding the ferromagnetic plating 603 on top of the signal trace 601, the magnetic field above the conductive 601 may increase thereby increasing the inductance of a transmission line that may include signal trace 601.

Of course, the use of a ferromagnetic conductive via 111 may be combined with a signal trace such as 601 with a ferromagnetic plating 603 to achieve a desired combined inductance.

Figure 7:
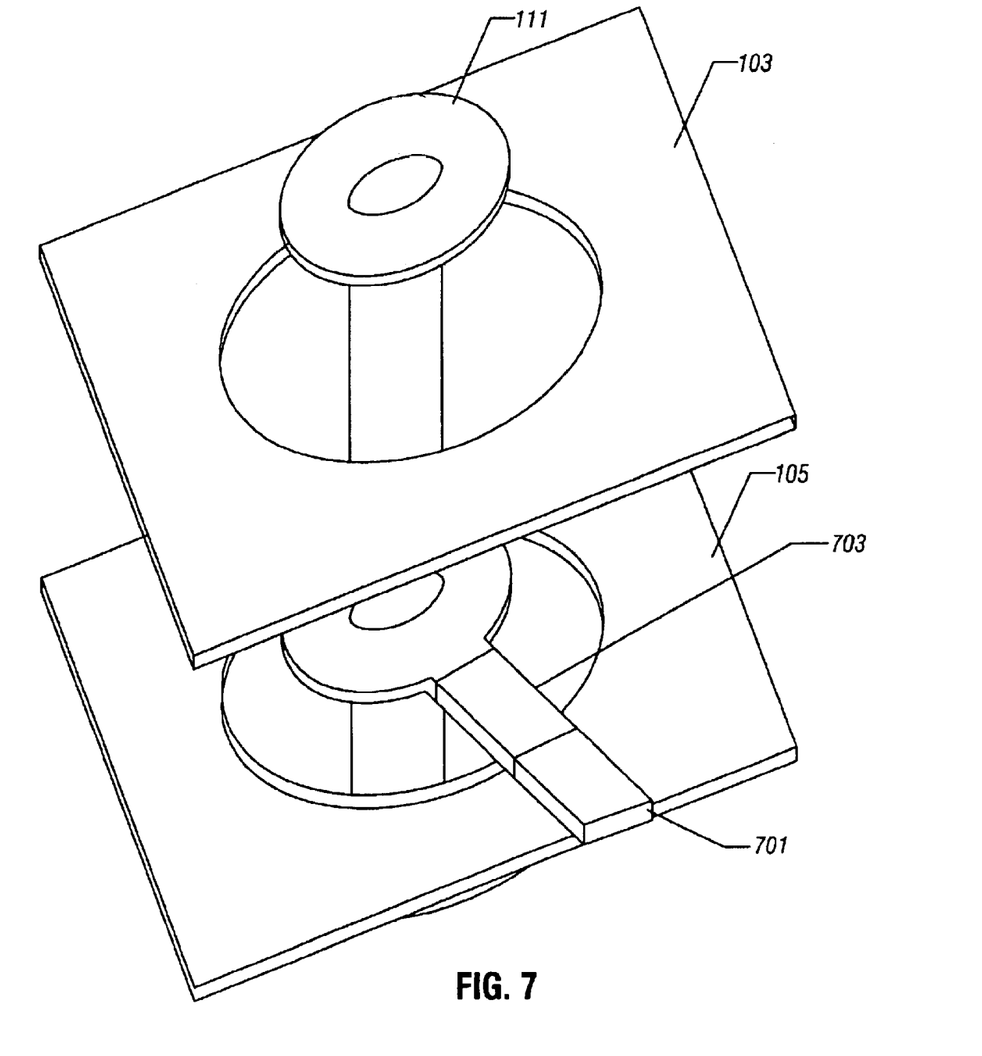
FIG. 7 is an exploded partial-view of a multi-layer printed-circuit board having a ferromagnetic trace section according to some embodiments of the present invention.

Referring now to FIG. 7, to increase the inductance in a signal trace 701, a section of the signal trace 701 may include a ferromagnetic section 703. A signal propagating through the signal trace 701 may travel through the ferromagnetic section 703 which may increase the magnetic field and therefore the inductance in that section of a transmission line. As discussed above, unitizing a ferromagnetic section such as 703 may be combined with other methods of increasing inductance such as utilizing a ferromagnetic material to form all or part of the conductive via 111.

Figure 8:
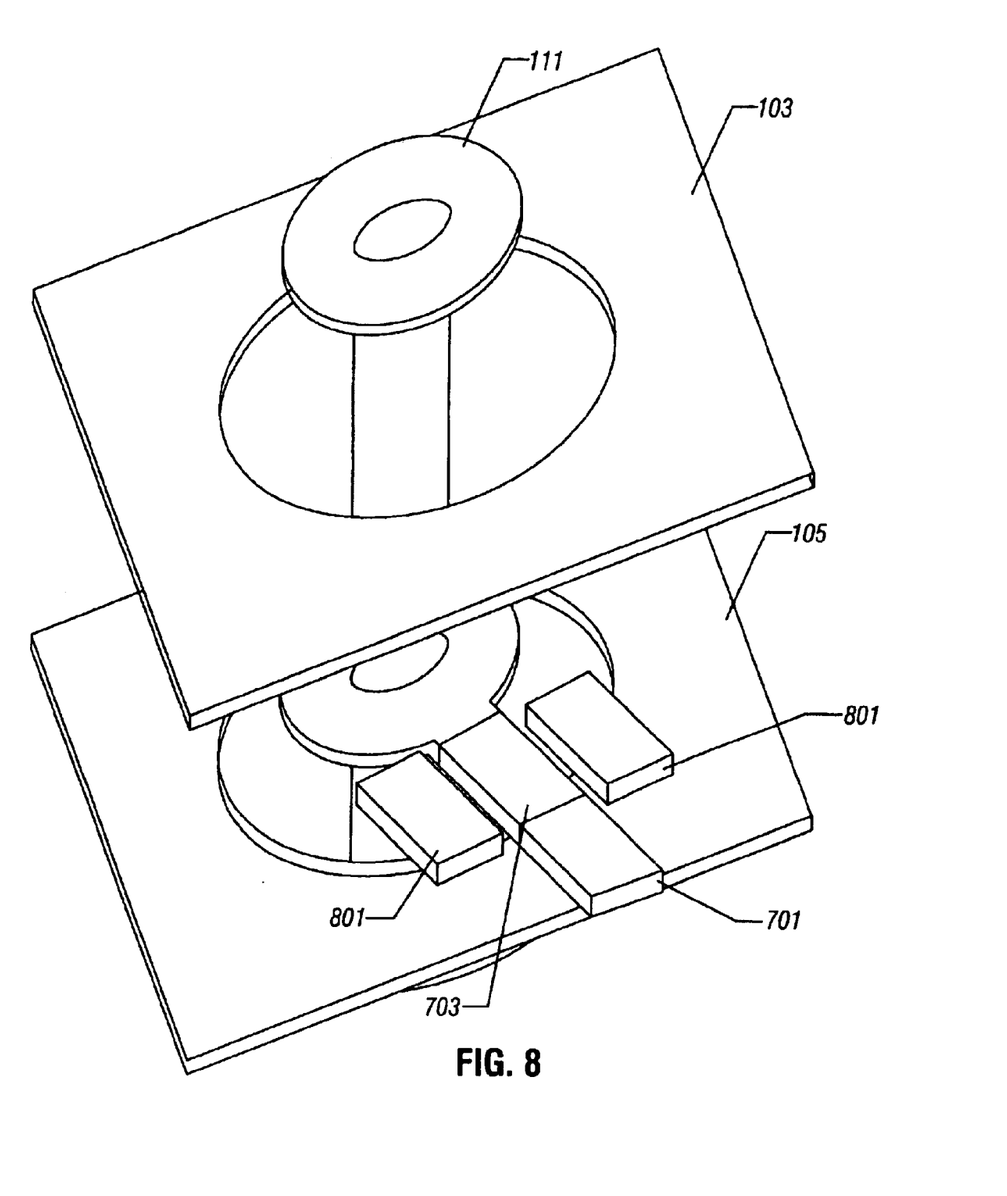
FIG. 8 is an exploded partial view of a multi-layer printed-circuit board having a signal trace utilizing ferromagnetic islands according to some embodiments of the present invention.

Referring now to FIG. 8, ferromagnetic islands 801 may be constructed adjacent to the signal trace 701. These ferromagnetic islands may serve to increase the magnetic fields surrounding signal trace 701 which may thereby increase the inductance associated with signal trace 701. The operation of the ferromagnetic section 703 may be as described previously. In addition to surface deposition, in some embodiments, the ferromagnetic islands 801 may be formed from a plated through via with ferromagnetic material on surface pads and on the body of the via.

Figure 9:
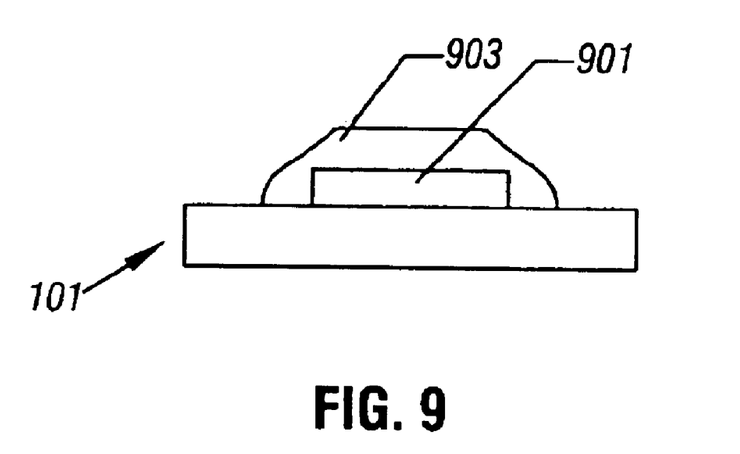
FIG. 9 is a cross-sectional view of a printed-circuit board conductor having a ferromagnetic surround according to some embodiments of the present invention.

Referring now to FIG. 9, in still another embodiment, a signal trace 901 may be partially encapsulated by a ferromagnetic covering 903. This ferromagnetic covering 903 may provide a high permeability path for a B-field (magnetic field) above and to the side of the signal conductor 901. Therefore, by using this ferromagnetic covering, the magnetic field associated with the signal trace 901 may be increased and the associated inductance may increase.

Figure 10:
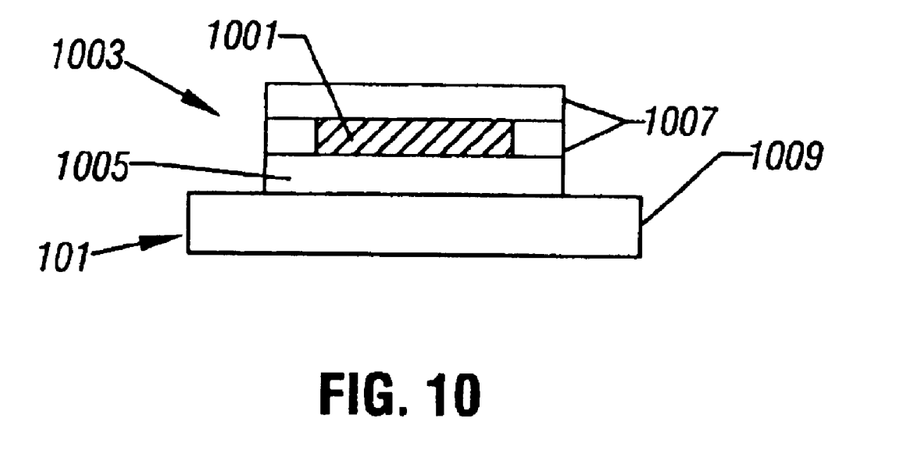
FIG. 10 is a cross-sectional view of a printed-circuit board trace having a partial ferromagnetic surround according to some embodiments of the present invention.

As still another embodiment of the present invention, as illustrated in FIG. 10, a signal trace 1001 may be surrounded by ferromagnetic surround 1003. This ferromagnetic surround 1003 may consist of a base section 1005 and a ferromagnetic covering 1007. In some embodiments, the ferromagnetic surround 1003 may be constructed by depositing a first ferromagnetic material 1005 on the surface of the printed-circuit board material 1009. A copper conductive trace 1001 may then be deposited on top of the ferromagnetic material 1005. The ferromagnetic covering 1007 may be constructed such that it covers the signal trace 1001.

This configuration surrounds the signal trace 1001 with ferromagnetic material that may increase the inductance associated with the signal trace 1001. An additional benefit of this configuration of a ferromagnetic surround 1003 may include the shielding of the signal trace 1001 which may reduce undesired radiation by signals in a transmission line including signal trace 1001.

As discussed previously, many techniques described herein may be combined to achieve a desired inductance in a particular transmission line. For example, the ferromagnetic surround 1003 may be combined with a ferromagnetic conductive via to achieve a desired inductance value.

As another example, ferromagnetic islands as discussed in association with FIG. 8 may be combined with a conductive via which may incorporate ferromagnetic rings such as described in association with FIG. 5. In still other embodiments, a ferromagnetic via or a signal trace utilizing ferromagnetic material may be utilized individually to achieve a desired inductance.

Figure 11:
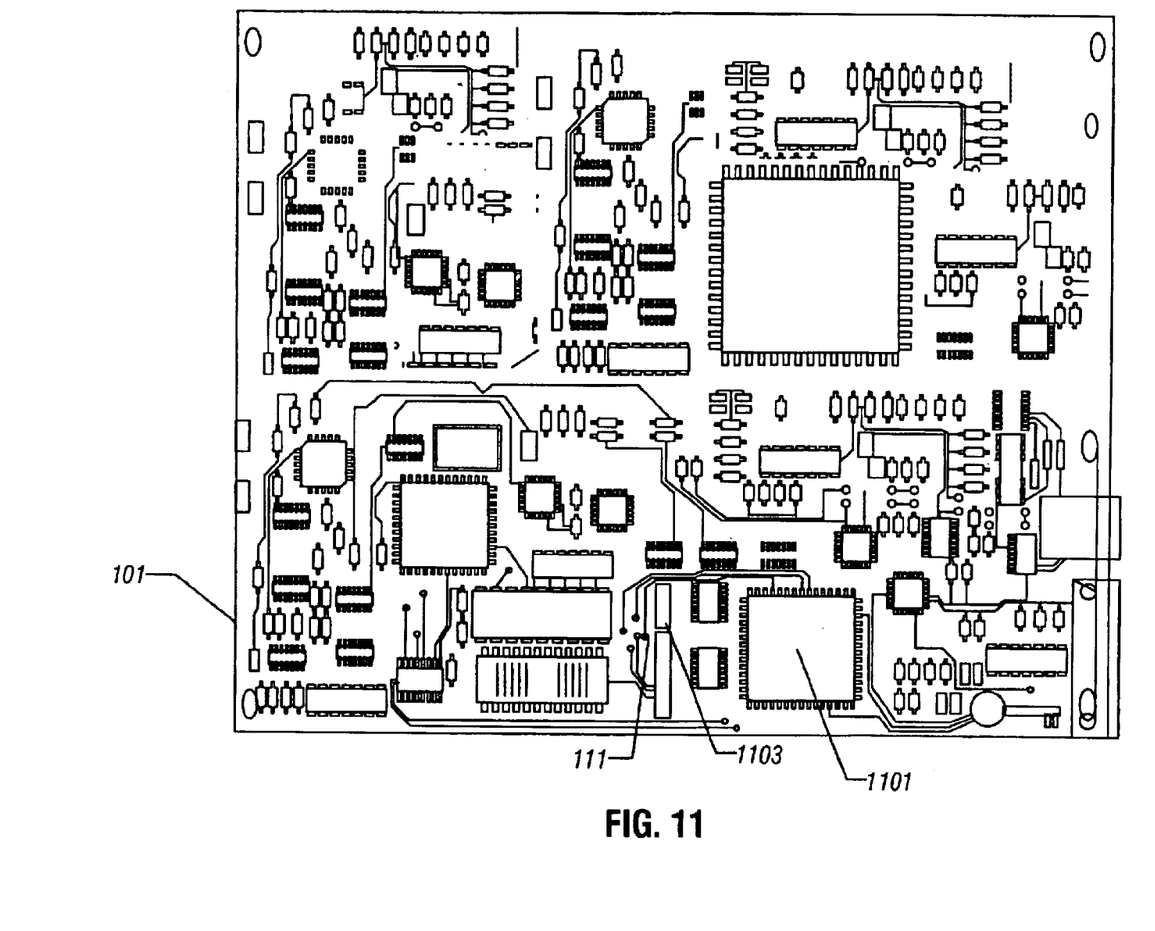
FIG. 11 is a circuit board including an electronic device coupled to the circuit board in a transmission line.

Systems may be constructed utilizing a multilayer printed circuit board according to embodiments of the invention. As illustrated in FIG. 11, a circuit board 101 includes an electronic device 1100 coupled to the circuit board and a transmission line 1103. The transmission line 1103 may also include a conductive via 111 that may operate as described above. The transmission line may also include signal traces utilizing ferromagnetic materials as described above in association with various embodiments of the invention.

While the present invention has been described with respect to a limited number of embodiments, those skilled in the art will appreciate numerous modifications and variations therefrom. For example, while nickel and nickel alloys may be desirable ferromagnetic materials to achieve increased inductance as described above, other ferromagnetic materials of which iron and cobalt and alloys thereof are examples may be substituted therefore in some embodiments. Therefore, it is intended that the appended claims cover all such modifications and variations that fall within the true spirit and scope of the present invention.

What is claimed is:

1. A system comprising:
    a multi-layer printed-circuit board substrate;
    the printed circuit board substrate having a first transmission line, a second transmission line constructed within a layer different from the first transmission line, a third transmission line constructed in a layer different from the first and the second transmission lines;
    a conductive via connecting the first transmission line to the third transmission line; and
    a ferromagnetic ring surrounding the conductive via on at least one of the layers of the printed-circuit board.

2. The system of claim 1 wherein a ferromagnetic island is coupled to at least one of the transmission lines.

3. The system of claim 1 wherein the ferromagnetic ring material is nickel.

4. The system of claim 1 wherein the ferromagnetic ring is constructed, in part, of a nickel alloy.

5. The system of claim 1 wherein at least one of the transmission lines includes a signal trace cover constructed, at least in part, by a ferromagnetic material.

6. The system of claim 1 wherein at least one of the transmission lines includes a signal trace constructed, at least in part, of a ferromagnetic material.

\* \* \* \* \*